United States Patent [19]

Tanner et al.

[11] Patent Number: 4,542,255

[45] Date of Patent: Sep. 17, 1985

[54] GRIDDED THIN FILM SOLAR CELL

[75] Inventors: David P. Tanner, Thousand Oaks; Don L. Morel, Agoura Hills; Robert R. Gay, Granada Hills, all of Calif.

[73] Assignee: Atlantic Richfield Company, Los Angeles, Calif.

[21] Appl. No.: 567,601

[22] Filed: Jan. 3, 1984

[51] Int. Cl.[4] .............................................. H01L 31/06
[52] U.S. Cl. .................................... 136/249; 136/244; 136/256; 136/258; 357/30
[58] Field of Search ................ 136/244, 249 MS, 256, 136/258 AM, 260; 357/30

[56] References Cited

U.S. PATENT DOCUMENTS

| | | | |
|---|---|---|---|
| 3,483,038 | 12/1969 | Hui et al. | 136/244 |
| 3,880,633 | 4/1975 | Jordan et al. | 65/60 |
| 4,084,985 | 4/1978 | Evans, Jr. | 136/251 |
| 4,166,919 | 9/1979 | Carlson | 136/257 |
| 4,245,386 | 1/1981 | Kausche et al. | 29/572 |
| 4,281,208 | 7/1981 | Kowano et al. | 136/249 MS |
| 4,292,092 | 9/1981 | Hanak | 148/1.5 |
| 4,388,482 | 6/1983 | Hamakawa et al. | 136/258 AM |
| 4,400,244 | 8/1983 | Kroger et al. | 204/2.1 |

Primary Examiner—Aaron Weisstuch
Attorney, Agent, or Firm—Albert C. Metrailer

[57] ABSTRACT

An improved transparent conductor structure for thin film solar cells comprising a plurality of metallic strip conductors deposited on a transparent conductor and aligned substantially with the principal direction of current flow. The strip conductors preferably originate at an edge of the transparent conductor to which an adjacent cell back conductor is connected and are preferably interconnected along that edge by an additional strip conductor deposited in the same process step.

1 Claim, 3 Drawing Figures

GRIDDED THIN FILM SOLAR CELL

BACKGROUND OF THE INVENTION

This invention relates to thin film solar cells and more specifically to an improved transparent conductor contact including a metallic grid.

Considerable research and development has been directed towards producing commercially practical thin film solar cells. In such cells the semiconductor material, typically silicon, is on the order of 0.5 micron thick as compared to conventional single crystal silicon wafers having a thickness on the order of 250 microns. Thus a considerable savings in semiconductor material is achieved by use of thin film structures. Further savings are anticipated because thin film processes are usually more easily automated so that labor costs per watt of output power should be considerably less than that required for the conventional cells.

An example of thin film solar cell structures is illustrated in U.S. Pat. No. 4,292,092 issued to Hanak on Sept. 29, 1981. The Hanak structure employs a glass substrate, a transparent front conductor deposited and patterned on the glass substrate, a thin semiconductor film and a metallic back contact. The performance of such cells is quite dependent upon the sheet resistivity of the transparent conductor which forms a front, light receiving, contact for the active regions of the solar cell. One of the primary teachings of Hanak is a laser scribing technique used to break the sheet of semiconductor material into a series of long narrow strips which are series connected along their edges to add the voltages from individual cells while limiting the maximum current which must be carried by the various conductors. While the teachings of Hanak improve the efficiency of solar cells by reducing internal resistance, resulting modules are not practical for many commercial uses. As indicated by the examples of Hanak, the individual cells are fairly narrow. Thus, on substrates measuring 7.6 centimeters square, ten to twelve individual cells were fabricated. When these teachings are extended to commerical sized modules, for example one by four feet, it can be seen that an extremely large number of individual cells would be fabricated in each module. The large number of cells would not only increase the fabrication cost but would cause the modules to have a very high voltage but low current output. Experience has indicated that module voltages on the order of twelve volts or less are desirable and therefore it is preferred that each module contain no more than about 24 individual cells connected in series.

SUMMARY OF THE INVENTION

Accordingly an object to the present invention is to provide an improved transparent conductor structure in a thin film solar cell.

Another object of the present invention is to provide a thin film solar cell transparent conductor having reduced effective resistivity.

In accordance with the present invention, a thin film solar cell transparent conductor includes a plurality of metallic strips deposited on the transparent conductor in alignment with the principal direction of current in the transparent conductor. In a preferred module structure the metallic strips extend from one edge of the transparent conductor where they are interconnected by a second metallic strip and where they make contact with an adjacent cell.

BRIEF DESCRIPTION OF THE DRAWINGS

The present invention may be better understood by reading the following detailed description of the preferred embodiments with reference to the accompanying drawings wherein.

DESCRIPTION OF THE PREFERRED EMBODIMENTS

Figure 1:
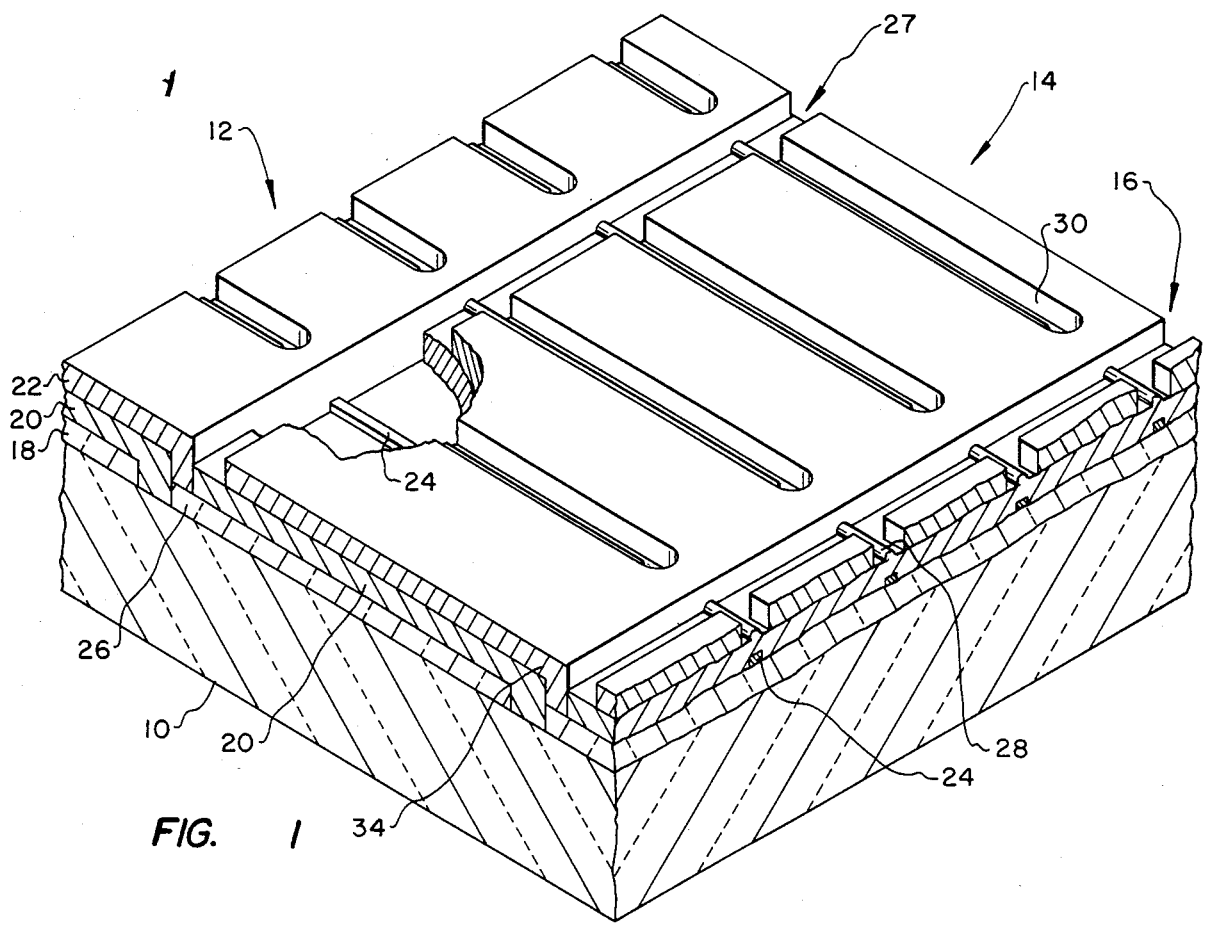
FIG. 1 is an isometric view of a portion of a thin film solar cell according to the present invention.

With reference now to FIG. 1 there is illustrated a portion of a thin film solar module according to the present invention. The basic mechanical structure of such a module comprises a glass substrate 10 which is typically on the order of 2 millimeters thick and, for commercial purposes, may have major dimensions of 1 by 4 feet. In FIG. 1 portions of three spearate cells 12, 14, and 16 are illustrated. A commercial module may have anywhere from ten to thirty such cells connected in series as illustrated. Each of the cells comprises three basic layers 18, 20, and 22. Layer 18 is a transparent conductor, typically tin oxide with various dopants such as antimony or fluorine. Layer 18 is typically 0.1 to 1.0 microns thick. Layer 20 comprises a thin film of semiconductor material containing an active p-n junction and is typically on the order of 0.5 microns thick. The semiconductor layer 20 typically includes a three layer structure such as that taught in the above referenced Hanak patent or that taught in the more detailed disclosure of Hamakawa et al, U.S. Pat. No. 4,388,482 issued June 14, 1983. Back contact layer 22 preferably comprises a thin film of aluminum deposited by sputtering or evaporation techniques to a thickness of approximately 0.1 micron. The layers 18, 20 and 22 may be deposited as continuous layers on the substrate 10 and selectively patterned by known techniques such as the laser processing technique taught by Hanak.

Figure 2:
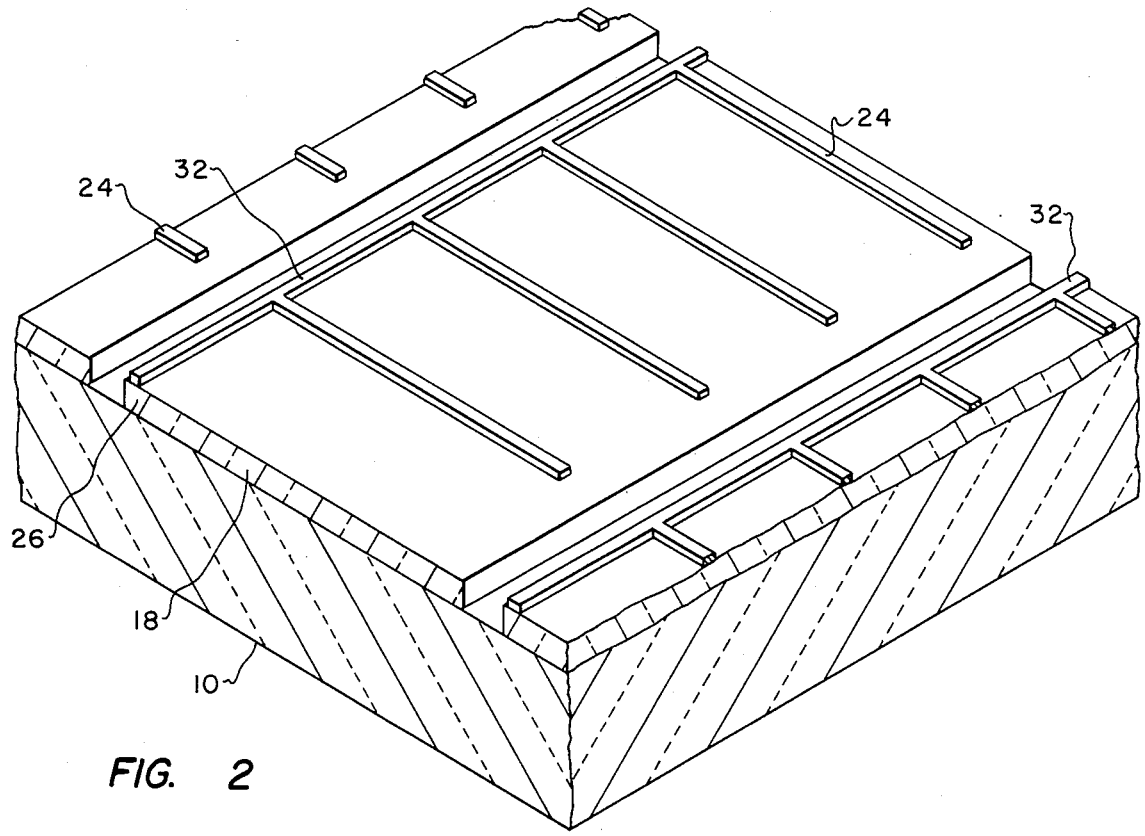
FIG. 2 is an isometric view of a partially fabricated solar cell according to the present invention illustrating in particular the transparent conductor structure.

In addition to the above described structure, which is generally conventional, there is illustrated in FIG. 1 a plurality of metallic strips 24 which are shown in more detail in FIG. 2. Metallic strip conductors 24 are deposited directly on the transparent conductive layer 18 and extend generally from a first edge 26 thereof across the width of strips 18 in the principal direction of current flow through the transparent conductor. As illustrated in the figure, the top contact 22 of a cell 12 contacts the transparent contact of cell 14 along edge 26. Current therefore flows generally from the edge 26 from left to right in the figure through transparent conductor 18 to one face of the active semiconductor layer 20. It is the series resistance of this layer 18 which has limited the maximum width of a single cell such as cell 14. Metallic strip conductors 24 dramatically reduce the effective resistance of the transparent conductor layer 18, allowing individual cells to be fabricated to essentially any desired width. While the conductive strips 24 cause some reduction in light reaching the active semiconductor layer, this is partially offset by the reduced number of dead spaces at edges 26 where adjacent cells interconnect and more importantly allows solar modules to be designed according to the desired output voltage for a given commercial application.

Metallic strips 24 are preferably applied over the transparent conductive layer 18 either by screen printing or evaporation through a mask. In the case of screen printing, a suitable commercially available screen printing paste is forced onto the surface through a patterned screen. The paste may contain, for example, silver powder, glass frit, and a suitable organic vehicle or binder. After application to the transparent layer, the paste is fired to drive off the organic vehicle and leave the silver and glass frit behind. The glass frit fuses to the substrate providing a strong bond while the silver provides the desired electrical conductivity. If an evaporation technique is used, various metals, such as silver, but preferably aluminum, will provide a high quality contact. If screen printed, strip conductors 24 should be approximately 25 microns in height while if evaporated, they should be approximately 5 microns thick.

As illustrated in FIG. 1, the active layer 20 is deposited over the transparent conductor 18 and the metallic strip conductors 24. As illustrated at 28 the layer 20, being much thinner than the conductors 24, will conform to the conductor resulting in the raised ridges 28. While some shorting is anticipated between the multilayers of semiconductor 20 at the edges of conductor 24, the extremely high lateral resistivity of such layers prevents any significant loss of power.

As illustrated at 30 the top contact 22 should be patterned so as not to overlie any portion of the strip conductors 24. The cutouts 30 are preferably generated at the same time and using the same methods as are used to separate the metallic layer 22 along the region 27 where adjacent cells meet. In this way no additional processing steps are required. Thus conventional photoresist additive or removal processes may be used to appropriately pattern the top contact 22. If desired, a metal mask may be employed in an evaporation process so that the layer 22 is only deposited where desired. All such processes are well known and form no part of the present invention.

With more particular reference now to FIG. 2, there is illustrated a second metallic strip conductor 32 interconnecting the ends of strips 24 along edge 26 of transparent conductor 18. This additional strip conductor 32 may be used if desired and can provide certain advantages to the overall structure. Thus, if desired, the transparent conductor layer 18 may be scribed after deposition of metallic conductors 24 and 32. Conductor 32 may then be used as a guide during the scribing process. Strip 32 can also provide an improved contact to the top conductor of the adjacent cell. In many prior art structures the semiconductor layer which is deposited on top of the structure illustrated in FIG. 2 is scribed or otherwise patterned to break the semiconductor layer into the individual cells prior to deposition of the top metallic contact. It has been found that the semiconductor layer can remain in a continuous layer without significant loss of power if appropriate contacts between adjacent cells can be made. It has also been found that the top metallic contact of a cell, for example cell 12, can be connected to the front contact of an adjacent cell, for example cell 14, by fusing directly through an intermediate semiconductor layer. Thus after deposition of the metal contact 22 shown in FIG. 1, isolated heating, by for example a laser, can cause the metallization 22 to alloy directly through the extremely thin semiconductor layer 20 thereby forming a localized direct bond between strip conductor 32 and the adjacent top metal conductor 22.

Figure 3:
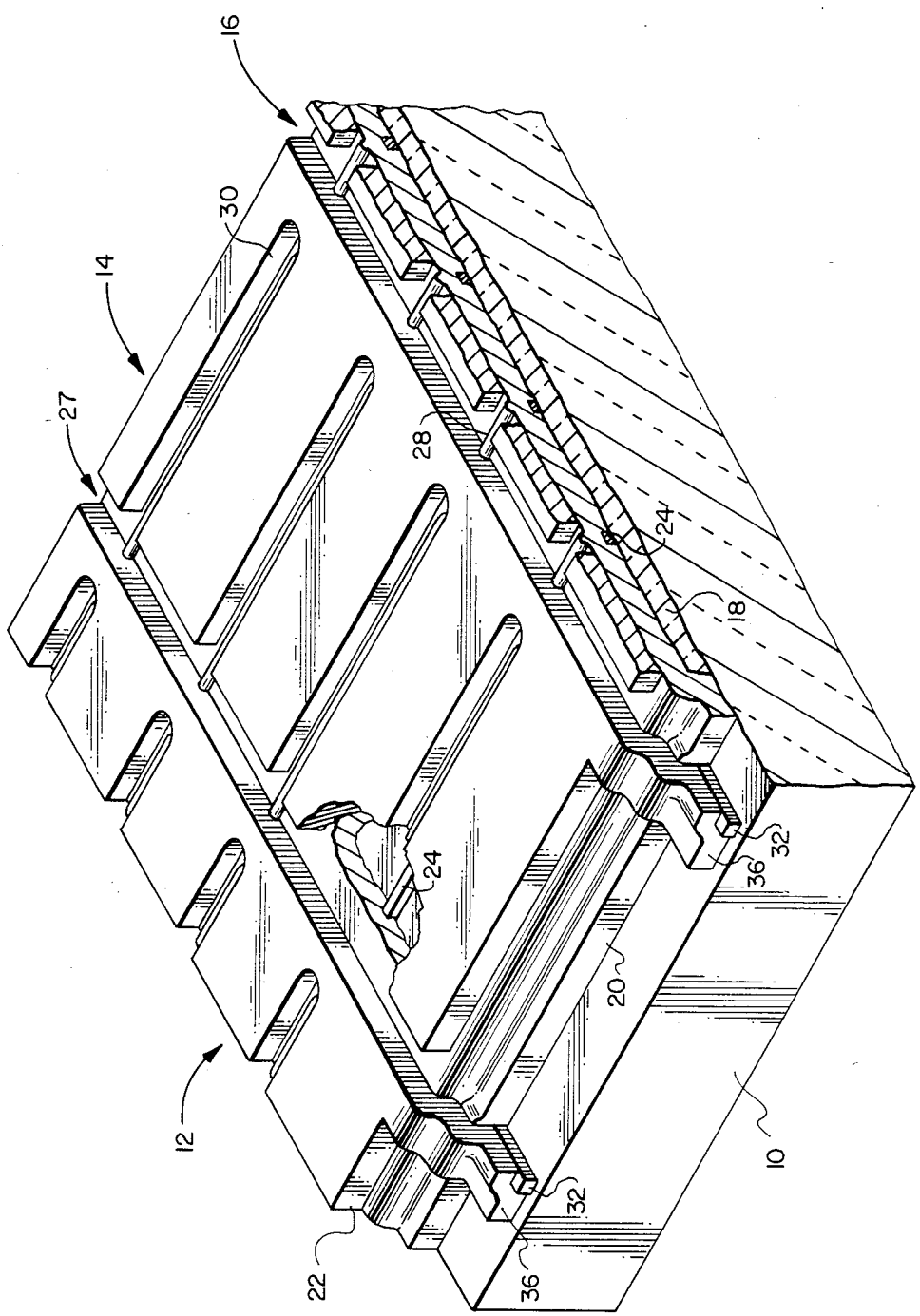
FIG. 3 is an isometric view of a partially fabricated cell according to an alternative embodiment of the present invention.

Alternatively, where active layer 20 is not patterned, strip 32 can be used as a buss bar for making connections between adjacent cells at its end only, as shown in FIG. 3. Thus one or both ends of bar 32 may be extended on substrate 10 beyond layer 18. Likewise, portions 36 of layer 22 would be extended to contact one or both ends of bar 32 to complete intercell connections. A similar arrangement is illustrated in U.S. Pat. No. 4,281,208, issued to Kuwano et al on July 28, 1981. However, the highly conductive metallic conductor 32 of the present invention makes such an arrangement practical in high power applications. The side contacts of the Kuwano patent would not be practical, except for low power applications such as pocket calculators, since the small area contacts to the transparent conductor taught therein would greatly increase device resistance.

In some applications it may be desirable for the back contact layer 22 to be transparent. The metallic strip conductors 24 and 32 can also be used to reduce series resistance of such devices. In other applications both the front contact layer 18 and the back contact layer 22 will be transparent. In such a case the strip conductors 24 can be applied to both contacts in an interdigitated arrangement. In this arrangement cross conductor strip 32 would be positioned along edge 34 of layer 22.

While the present invention has been illustrated and described with reference to particular structures and methods of construction, various modifications and changes can be made therein within the scope of the present invention as defined by the appended claim.

What is claimed is:

1. In a photovoltaic solar module having a plurality of series connected cells interconnected on a single glass substrate wherein each cell comprises a first conductor layer deposited on said substrate, a thin film semiconductor layer deposited on said first conductor layer and a second conductor layer deposited on said semiconductor layer and wherein said second conductor layer of each cell is in ohmic contact with the first conductor layer of an adjacent cell and where at least one of said first and second conductor layers is transparent, the improvement comprising:

a plurality of first metallic conductor strips deposited on said at least one transparent conductor layer of each cell, said plurality of strips positioned substantially normal to one edge of said one transparent conductor layer and originating at said one edge thereof; and a second metallic conductor strip deposited on said at least one transparent conductor layer of each cell, said second strip positioned along said one edge and interconnecting one end of each of said plurality of first strips;

wherein said second metallic conductor strip of each cell extends laterally onto said substrate from said cells, the other of said first and second conductor layers of each cell extends laterally on said substrate from said cells, the semiconductor layer is a continuous unpatterned sheet for all cells, and interconnection between adjacent cells is made by contacting the extended portion of said second metallic conductor strips of a first cell with the extended portion of said other conductor of an adjacent cell at a point on said substrate laterally displaced from said semiconductor sheet.

* * * * *